(12) United States Patent
Meynants

(10) Patent No.: US 11,322,532 B2
(45) Date of Patent: May 3, 2022

(54) BACKSIDE ILLUMINATED IMAGE SENSOR

(71) Applicant: ams AG, Premstaetten (AT)

(72) Inventor: Guy Meynants, Retie (BE)

(73) Assignee: AMSAG, Premstaetten (AT)

( * ) Notice: Subject to any disclaimer, the term of this patent is extended or adjusted under 35 U.S.C. 154(b) by 48 days.

(21) Appl. No.: 16/616,581

(22) PCT Filed: May 7, 2018

(86) PCT No.: PCT/EP2018/061711
§ 371 (c)(1),
(2) Date: Nov. 25, 2019

(87) PCT Pub. No.: WO2018/219592
PCT Pub. Date: Dec. 6, 2018

(65) Prior Publication Data
US 2020/0127029 A1   Apr. 23, 2020

(30) Foreign Application Priority Data
May 30, 2017   (EP) .................................... 17173499

(51) Int. Cl.
*H01L 27/146*   (2006.01)
*H01L 49/02*   (2006.01)

(52) U.S. Cl.
CPC .... *H01L 27/14609* (2013.01); *H01L 27/1464* (2013.01); *H01L 27/14636* (2013.01); *H01L 28/60* (2013.01)

(58) Field of Classification Search
CPC ......... H01L 27/14609; H01L 27/14636; H01L 27/1464
See application file for complete search history.

(56) References Cited

U.S. PATENT DOCUMENTS 9,379,149 B2 *   6/2016   Yamashita ........ H01L 27/14636
2008/0305572 A1   12/2008   You
(Continued)

FOREIGN PATENT DOCUMENTS

| TW | 201703242 | 1/2017 |
| WO | 96/27907 | 9/1996 |
| WO | 2013/091123 | 6/2013 |

OTHER PUBLICATIONS

European Patent Office, International Search report for PCT/EP2018/061711 dated Sep. 19, 2018.
(Continued)

*Primary Examiner* — Bilkis Jahan
*Assistant Examiner* — Victor V Barzykin
(74) *Attorney, Agent, or Firm* — MH2 Technology Law Group LLP

(57) ABSTRACT

The backside illuminated image sensor comprises a substrate of semiconductor material, detector elements arranged at a main surface, a dielectric layer on or above the main surface, a first capacitor layer and a second capacitor layer above the main surface, the capacitor layers forming a capacitor (C1, C2). A peripheral circuit is integrated in the substrate apart from the detector elements, the peripheral circuit being configured for one or more operations of the group consisting of voltage regulation, charge pump operation and stabilization of clock generation, and the capacitor layers are electrically connected with contact regions of the peripheral circuit.

16 Claims, 4 Drawing Sheets

(56) References Cited

U.S. PATENT DOCUMENTS

| | | |
|---|---|---|
| 2011/0049589 A1 | 3/2011 | Chuang |
| 2011/0278687 A1* | 11/2011 | Huang .............. H01L 27/14641 |
| | | 257/432 |
| 2012/0187514 A1 | 7/2012 | Mentzer |
| 2014/0030842 A1 | 1/2014 | Chuang et al. |
| 2014/0084407 A1* | 3/2014 | Churchwell ...... H01L 27/14634 |
| | | 257/443 |
| 2014/0300698 A1 | 10/2014 | Wany |
| 2017/0104019 A1* | 4/2017 | Jung .................. H01L 27/1462 |
| 2017/0244921 A1* | 8/2017 | Velichko .............. H04N 5/3597 |

OTHER PUBLICATIONS

Han, H. et al.: "Evaluation of a Small Negative Transfer Gate Bias on the Performance of 4T CMOS Image Sensor Pixels" International Image Sensor Workshop, 2007 pp. 238-240 (available on www.imagesensors.org).

Kagawa, Y. et al.: "Novel Stacked CMOS Image Sensor with Advanced Cu2Cu Hybrid Bonding" proc. IEDM, Dec. 2016.

Meynants, G. et al.: "Backside Illuminated CMOS Active Pixel Sensor with global shutter and 84 dB dynamic range" Scientific Detector Workshop, Firenze, Oct. 8, 2013.

\* cited by examiner

BACKSIDE ILLUMINATED IMAGE SENSOR

BACKGROUND OF THE INVENTION

Backside illuminated image sensors comprise a plurality of detector elements forming a pixel array for image detection. The pixel array is surrounded by a peripheral area, in which readout circuits are disposed, in particular CMOS circuits, including row logic, column amplifiers, analog-to-digital converters, clock generation and output drivers. The width of the peripheral area may be less than 100 µm. Very small dimensions of the image sensor are required in many applications, for which endoscopes are a typical example.

The image quality is improved if a capacitive decoupling is provided for the readout circuitry of the image sensor. It may be favourable if the driving voltage of the transfer gate of a pixel is negative in order to reduce the dark current and improve the dynamic range, as discussed by H. Han et al., "Evaluation of a Small Negative Transfer Gate Bias on the Performance of 4 T CMOS Image Sensor Pixels", International Image Sensor Workshop 2007, pp 238-240. It may also be favourable if the driving voltage of the reset gate of a pixel is higher than the supply voltage.

Variations in the current consumption of the sensor can cause ripple on the supply voltage, which may also be prone to interference. The frequency of an oscillator, which is integrated for the generation of clock signals that control the operation of the sensor, may depend on the supply voltage and the ambient temperature. A control circuitry is therefore usually required to be integrated in the image sensor.

WO 2013/091123 A1 discloses an optical sensor arrangement, in particular for use in an endoscope, which has a multi-wire line as an electrical connection between the distal end and the proximal end. The optical sensor arrangement is mounted directly on the multi-wire line.

US 2014/0030842 A1 discloses a backside illuminated image sensor comprising a semiconductor substrate, a sensor element at the front side of the substrate, and a capacitor overlying the sensor element. The capacitor increases a floating capacitance created between transistor connections and can also meet other circuit design needs, such as A/D conversion.

US 2014/0300698 A1 discloses an endoscopic arrangement provided with a plurality of image sensors, each of which generates a sensor clock by an uncontrolled oscillator. An electronic control circuitry detects the sensor clock and/or the sensor frame rate and/or the sensor image phase and adjusts the detected information to a reference clock.

G. Meynants et al., "Backside illuminated CMOS active pixel sensor with global shutter and 84 dB dynamic range", Scientific Detector Workshop, Florence 2013, describe the use of MiM capacitors for the sampling of pixel signals. The capacitors are disposed at the front side of a CIS global shutter pixel.

Y. Kagawa et al., "Novel Stacked CMOS Image Sensor with Advanced Cu2Cu Hybrid Bonding", Proc. IEDM, 2016, pp. 8.4.1-8.4.4, describe 3D stacked CMOS image sensors including a backside illuminated CMOS image sensor that is wafer-bonded to a CMOS readout IC.

SUMMARY OF THE INVENTION

The backside illuminated image sensor comprises a substrate of semiconductor material having a main surface, detector elements arranged at the main surface, a dielectric layer on or above the main surface, a first capacitor layer of electrically conductive material embedded in the dielectric layer and a second capacitor layer of electrically conductive material embedded in the dielectric layer at a distance from the first capacitor layer. The first and second capacitor layers form at least one capacitor.

A peripheral circuit is integrated in the substrate apart from the detector elements. The peripheral circuit is configured for voltage regulation and/or charge pump operation and/or stabilization of clock generation. The first and second capacitor layers are electrically connected with contact regions of the peripheral circuit.

The electrically conductive material may be a metal or electrically conductive polysilicon, for instance. Tungsten is a suitable metal, for instance. The capacitor layers may especially be formed by metallizations of a wiring. They may include additional electrically conductive layers arranged between the metallization levels of the wiring.

The capacitor may be formed on one level, in particular by interdigitated capacitor layers, or as a three-dimensional structure, in particular as a trench capacitor for large capacitance. A large capacitance per unit area can also be achieved by making the distance between the capacitor layers small and arranging HfO, $Al_2O_3$ or another high-κ dielectric in between.

One or more structured electrically conductive layers can be embedded in the dielectric layer, additionally to the capacitor layers. Electric connections can be provided to connect the capacitor layers to parts of the structured electrically conductive layer(s).

In an embodiment of the backside illuminated image sensor, at least one of the first and second capacitor layers comprises parallel strips arranged at a distance from one another. Each of the first and second capacitor layers may comprise parallel strips arranged at a distance from one another. In particular, the strips of the first capacitor layer may be parallel to the strips of the second capacitor layer, or the strips of the first capacitor layer may be transverse to the strips of the second capacitor layer.

In a further embodiment of the backside illuminated image sensor, the strips of the first capacitor layer and the strips of the second capacitor layer are interdigitated, the strips of the first capacitor layer are electrically connected to one another, and the strips of the second capacitor layer are electrically connected to one another.

In a further embodiment, the first and second capacitor layers are arranged in a three-dimensional structure.

In a further embodiment, the peripheral circuit has a width of less than 100 µm.

In a further embodiment, the peripheral circuit surrounds the detector elements.

A further embodiment comprises a further substrate of semiconductor material, which is bonded to the substrate. The dielectric layer is arranged between the substrate and the further substrate.

A further embodiment comprises a further dielectric layer on the further substrate. The further dielectric layer is arranged between the further substrate and the dielectric layer. The first capacitor layer and the second capacitor layer may be embedded in the further dielectric layer.

A further embodiment comprises a through-substrate interconnection penetrating the further substrate.

A further embodiment comprises a further contact region in the peripheral circuit and a further electric connection connecting the through-substrate interconnection with the further contact region.

BRIEF DESCRIPTION OF THE DRAWINGS

The following is a detailed description of examples of the backside illuminated image sensor in conjunction with the appended figures.

DETAILED DESCRIPTION

Figure 1:
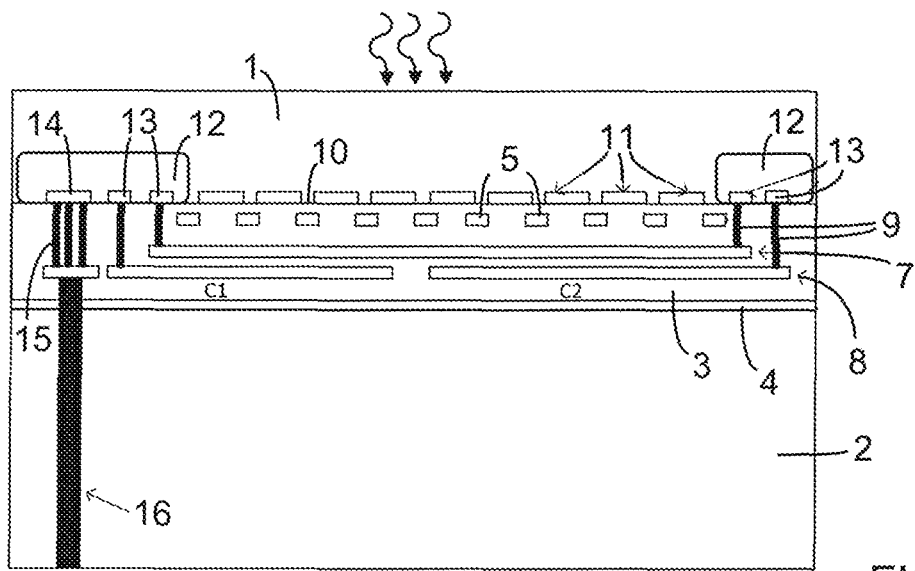
FIG. 1 is a cross-section of a backside illuminated image sensor with capacitors above the detector elements.

FIG. 1 is a cross-section of a backside illuminated image sensor. It comprises a substrate 1 of semiconductor material, which may be silicon, for instance. A dielectric layer 3, which may be silicon dioxide, for instance, is arranged on or above a main surface 10 of the substrate 1. A structured electrically conductive layer 5 is optionally embedded in the dielectric layer 3. The structured electrically conductive layer 5 may be provided as a pixel routing layer, for instance. It may be part of a wiring, which may comprise further structured electrically conductive layers and vertical interconnections. In particular, the structured electrically conductive layer 5 may be provided for horizontal connections, like control lines for charge transfer, for instance, and a further structured electrically conductive layer may be provided for vertical connections used for output and power supply, for instance.

Detector elements 11, which may be photodiodes, for instance, are arranged in the substrate 1 at the main surface 10. The detector elements 11 can especially be arranged in an array for image detection. Each detector element 11 can thus be employed to yield a pixel of an image that is to be detected. A peripheral circuit 12 is integrated in the substrate 1 apart from the detector elements 11. The region occupied by the peripheral circuit 12 is outside the region where the detector elements 11 are disposed. The peripheral circuit 12 may especially surround the region of the detector elements 11. Peripheral circuit 12 could also be at one side only.

A first capacitor layer 7 of electrically conductive material and a second capacitor layer 8 of electrically conductive material are arranged at a distance from one another in the dielectric layer 3 and form a capacitor C1. The number of capacitors thus formed is arbitrary. FIG. 1 shows one further capacitor C2 by way of example.

The electrically conductive material of the first and second capacitor layers 7, 8 may be a metal, in particular tungsten, aluminum or copper, for instance, or electrically conductive polysilicon, for instance. The capacitor dielectric may be a portion of the dielectric layer 3. Instead, a different capacitor dielectric may be arranged between the first and second capacitor layers 7, 8. A metal-insulator-metal capacitor of increased capacitance may be obtained by arranging a dedicated capacitor dielectric of high relative permittivity between the first and second capacitor layers 7, 8.

The sections of the first capacitor layer 7 and the second capacitor layer 8 are each electrically connected to contact regions 13 of the peripheral circuit 12 by vertical electric connections 9 in the dielectric layer 3. Thus the capacitors C1, C2 are connected to the peripheral circuit 12 and form components of the integrated circuit.

FIG. 1 shows an example of the first capacitor layer 7 that covers the entire area of the detector elements 11. The first capacitor layer 7 is thus also suitable as an electrical shield or a light reflector enabling a uniform reflection of the incident radiation to the focal plane.

In the example of the image sensor shown in FIG. 1, an optional further substrate 2 is bonded to the dielectric layer 3. The further substrate 2 may be a further semiconductor substrate, in particular a handling wafer, for instance. It may comprise electric components, in particular passive components like conductor tracks and resistors. The further substrate 2 may be bonded directly to the dielectric layer 3, or a bonding layer 4, which may be silicon dioxide, for instance, may be provided for this purpose.

The further substrate 2 may comprise an electrically conductive through-substrate interconnection 16, which is formed by an electrically conductive material arranged in a via penetrating the further substrate 2. A further contact region 14 of the peripheral circuit 12 and a further electric connection 15 in the dielectric layer 3 may be provided for an electric connection of the peripheral circuit 12 to the through-substrate interconnection 16.

Figure 2:
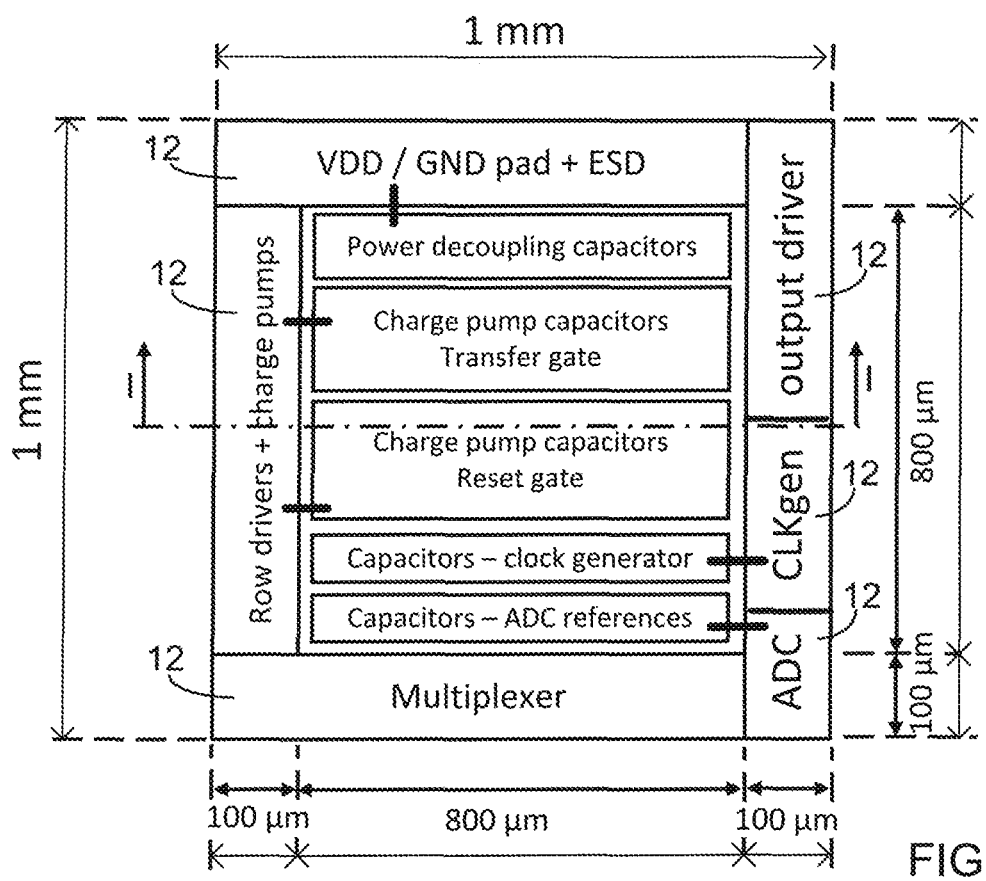
FIG. 2 shows a layout of a backside illuminated image sensor with capacitors above the detector elements.

FIG. 2 shows a layout of a backside illuminated image sensor comprising capacitors above the detector elements. The position of the cross-section shown in FIG. 1 is indicated in FIG. 2. The capacitors, which may include power decoupling capacitors, charge pump capacitors for the transfer gates and the reset gates of the pixels, capacitors for the stabilization of the clock generation and capacitors for analog-to-digital conversion references, for example, are arranged in the centre. The arrangement of the capacitors may occupy a central area of typically 800 µm×800 µm, which may be surrounded by a peripheral area having typically a width of 100 µm or less. Some typical components of the peripheral circuit 12 are named in the layout shown in FIG. 2.

Figure 3:
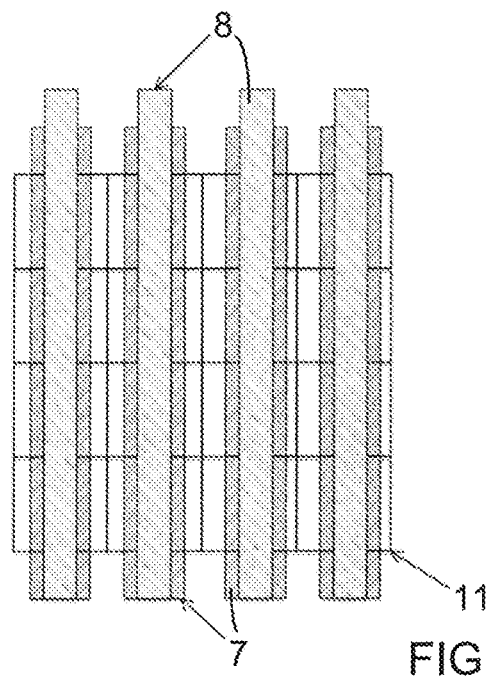
FIG. 3 is a top view of an arrangement of the pixels and the capacitor layers.

FIG. 3 is a top view of a suitable layout of a backside illuminated image sensor, which shows an example of the arrangement of the pixels and the capacitor layers. The first capacitor layer 7 forms a plurality of strips, which are the bottom capacitor plates. The second capacitor layer 8 forms a further plurality of strips, which are the top capacitor plates. The strips of the first capacitor layer 7 are arranged parallel at a distance from one another and are aligned with the strips of the second capacitor layer 8 and with rows of detector elements 11. Thus a plurality of capacitors is formed.

The connection of the capacitors to the peripheral circuit 12 may especially allow to use a common capacitor plate. In this case one of the first and second capacitor layers 7, 8 may be an entire layer or may be divided into sections that are larger than the strips shown in FIG. 3.

Figure 4:
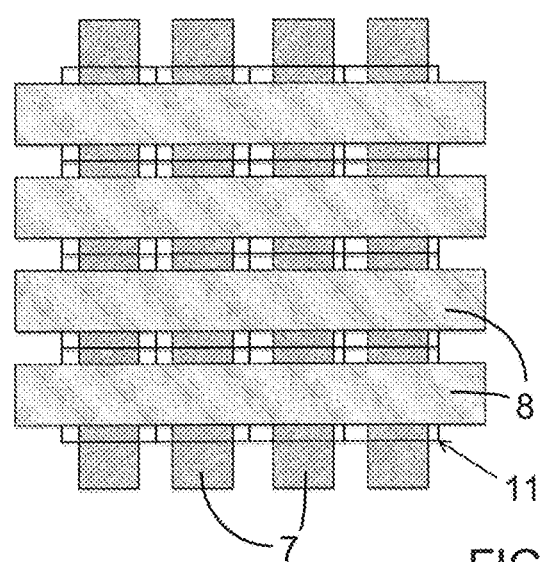
FIG. 4 is a top view of a further arrangement of the pixels and the capacitor layers.

FIG. 4 is a further top view of a suitable layout and shows a further example of the arrangement of the pixels and the capacitor layers. In the example according to FIG. 4, the first capacitor layer 7 forms a plurality of parallel spaced apart strips, which are the bottom capacitor plates, and the second capacitor layer 8 forms a plurality of parallel spaced apart strips, which are the top capacitor plates. The strips of the second capacitor layer 8 are arranged transverse to the strips of the first capacitor layer 7. The strips of the first capacitor layer 7 and the strips of the second capacitor layer 8 are aligned with rows of the detector elements 11 along two directions at a right angle.

The shape of the capacitor layers according to FIGS. 3 and 4 provides similar optical behaviour in all pixels. Additionally, the pattern of the capacitor layers 7, 8 may be designed for a backside reflection including a scattering effect in order to have the incident radiation completely absorbed. This may be desired in large photodiode structures, which are used in light sensors, for example.

Figure 5:
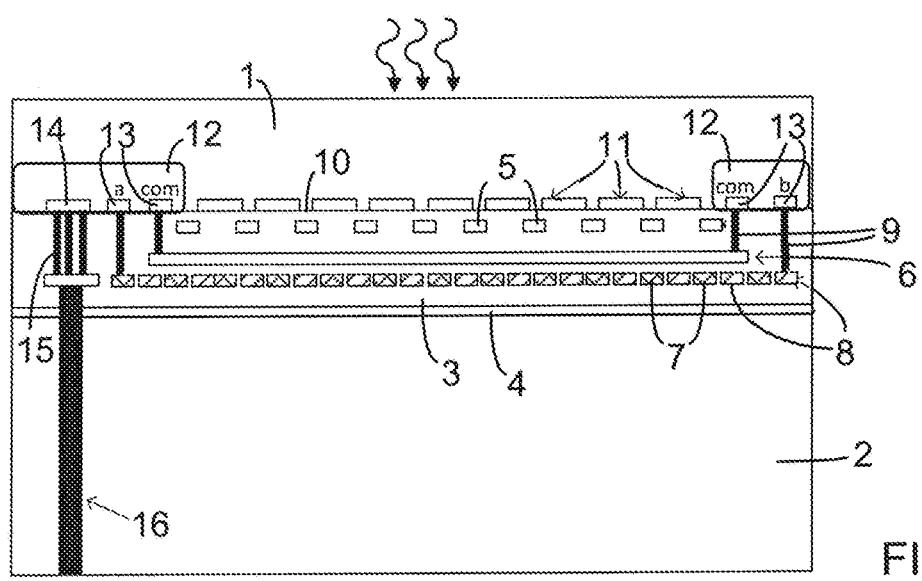
FIG. 5 is a cross-section according to FIG. 1 for a backside illuminated image sensor comprising a capacitor formed by an interdigitated structure.

FIG. 5 is a cross-section according to FIG. 1 for an image sensor comprising a capacitor formed by an interdigitated structure. Elements of the image sensor according to FIG. 5 that correspond to elements of the image sensor according to FIG. 1 are designated with the same reference numerals. In the image sensor according to FIG. 5, the first and second capacitor layers 7, 8 are structured in parallel strips, which are arranged at small distances from one another. According to their spatial succession, these strips are alternatingly electrically connected to one another and to the same contact region 13 of the peripheral circuit 12.

The electrically connected sections of the first capacitor layer 7 and the electrically connected sections of the second capacitor layer 8 are respectively indicated in FIG. 5 by the same type of hatching. The sections of the first capacitor layer 7, which are connected to the contact region 13 marked "a", are shown with a double hatching, whereas the sections of the second capacitor layer 8, which are connected to the contact region 13 marked "b", are shown with a single hatching.

In the example shown in FIG. 5, an optional further electrically conductive layer 6 forms a common capacitor plate, which is connected to the contact region 13 marked "com". The further electrically conductive layer 6 may instead be structured into separate sections forming further capacitor plates.

An interdigitated structure of capacitor plates is formed within the same layer by the strips of the first and second capacitor layers 7, 8 according to FIG. 5. The capacitor dielectric is provided by the regions of the dielectric layer 3 that are present between the strips. Instead or additionally, such an interdigitated structure of capacitor plates may be formed in a further layer.

In the image sensor according to FIG. 5, the further electrically conductive layer 6 covers the entire area that is occupied by the detector elements 11. The further electrically conductive layer 6 is thus also suitable as an electrical shield or a light reflector enabling a uniform reflection of the incident radiation to the focal plane.

Alternatively, the further electrically conductive layer 6 may be a light absorbing layer, which prevents radiation from being reflected back into the semiconductor material. An absorbing layer may be advantageous to avoid fringing effects, which generate undesired patterns in an image. Fringing effects can be due to tiny thickness variations of a thin silicon substrate. A metal may be suitable for an absorbing layer.

Figure 6:
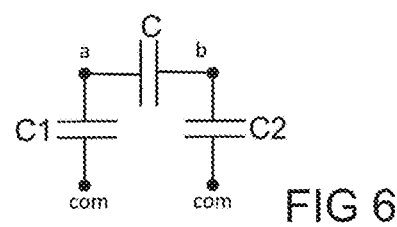
FIG. 6 is a circuit diagram showing the connection of the capacitors of the device according to FIG. 5.

FIG. 6 is a circuit diagram showing the connection of the capacitors of the image sensor according to FIG. 5. The common capacitor plate that is provided by the further electrically conductive layer 6 and the sections of the first capacitor layer 7, which are connected to the contact region 13 marked "a", form a first capacitor C1. The common capacitor plate that is provided by the further electrically conductive layer 6 and the sections of the second capacitor layer 8, which are connected to the contact region 13 marked "b", form a second capacitor C2. The sections of the first capacitor layer 7 and the sections of the second capacitor layer 8 form a further capacitor C. Each capacitor plate of the further capacitor C is also a plate of either the first capacitor C1 or the second capacitor C2.

Figure 7:
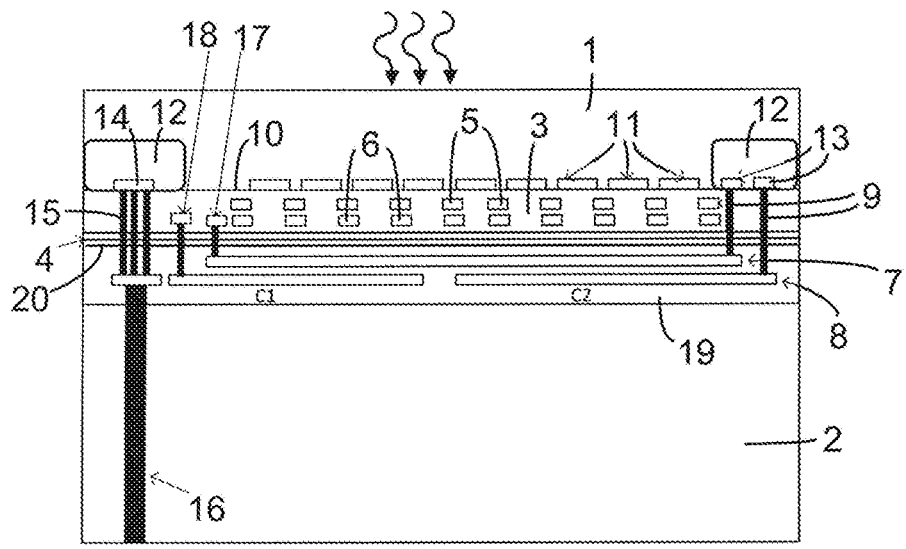
FIG. 7 is a cross-section according to FIG. 1 for a backside illuminated image sensor with electrically conductive layers arranged in dielectric layers of two substrates.

FIG. 7 is a cross-section according to FIG. 1 for an image sensor with electrically conductive layers provided on both substrates. Elements of the image sensor according to FIG. 7 that correspond to elements of the image sensor according to FIG. 1 are designated with the same reference numerals. In the image sensor according to FIG. 7, a further dielectric layer 19 is provided on the further substrate 2. The bonding layer 4, which may be silicon dioxide, for instance, is arranged between the dielectric layer 3 and the further dielectric layer 19. The bonding layer 4 is optional; the dielectric layer 3 may be bonded directly to the further dielectric layer 19.

In the image sensor according to FIG. 7, the first capacitor layer 7 and the second capacitor layer 8 are embedded in the further dielectric layer 19. The electric connections 9 between the contact regions 13 and the capacitor layers 7, 8 penetrate the bonding layer 4 and reach into the further dielectric layer 19. Furthermore, a capacitor connection 17 may be provided for an electric connection of the first capacitor layer 7 with the structured electrically conductive layer 5 or with a further structured electrically conductive layer 6 in the dielectric layer 3, and a further capacitor connection 18 may be provided for an electric connection of the second capacitor layer 8 with the structured electrically conductive layer 5 or with a further structured electrically conductive layer 6 in the dielectric layer 3.

In the image sensor according to FIG. 7, the first capacitor layer 7 covers the entire area that is occupied by the detector elements 11. Therefore the first capacitor layer 7 is also suitable as a light reflector or an electrical shield. FIG. 7 also shows an optional reflecting layer 20, which may be arranged on or in the further dielectric layer 19. The reflecting layer 20 is thus located between the dielectric layer 3 and the capacitor layers 7, 8. The reflecting layer 20 may in particular be arranged between the bonding layer 4 and the further dielectric layer 19.

Figure 8:
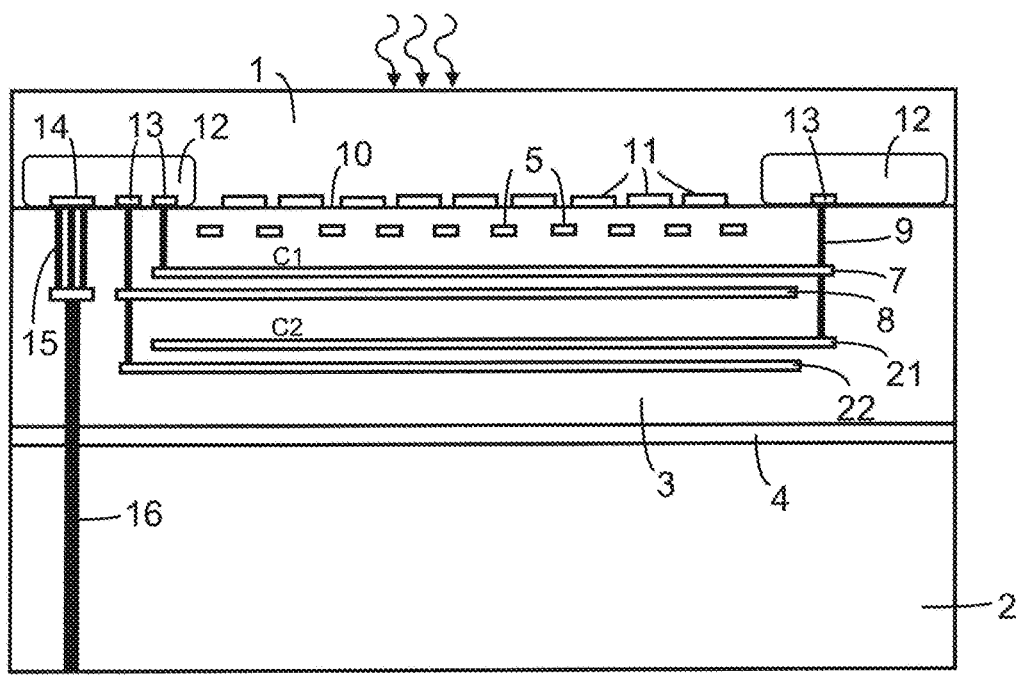
FIG. 8 is a cross-section according to FIG. 1 for a backside illuminated image sensor with stacked capacitors.

FIG. 8 is a cross-section according to FIG. 1 for an image sensor with stacked capacitors. Elements of the image sensor according to FIG. 8 that correspond to elements of the image sensor according to FIG. 1 are designated with the same reference numerals. In the image sensor according to FIG. 8, a third capacitor layer 21 and a fourth capacitor layer 22 are provided. The capacitor layers 7, 8, 21, 22 are arranged in a vertical sequence and separated from one another by portions of the dielectric layer 3. Thus a first capacitor C1 and a second capacitor C2 are arranged one above the other.

In the example shown in FIG. 8, the first capacitor layer 7 and the third capacitor layer 21 are electrically connected, and the second capacitor layer 8 and the fourth capacitor layer 22 are also electrically connected. Thus the first capacitor C1 and the second capacitor C2 are connected in parallel, so that the capacitances of the first capacitor C1 and the second capacitor C2 are added. Other electric connections may instead be suitable for further embodiments of the image sensor.

Figure 9:
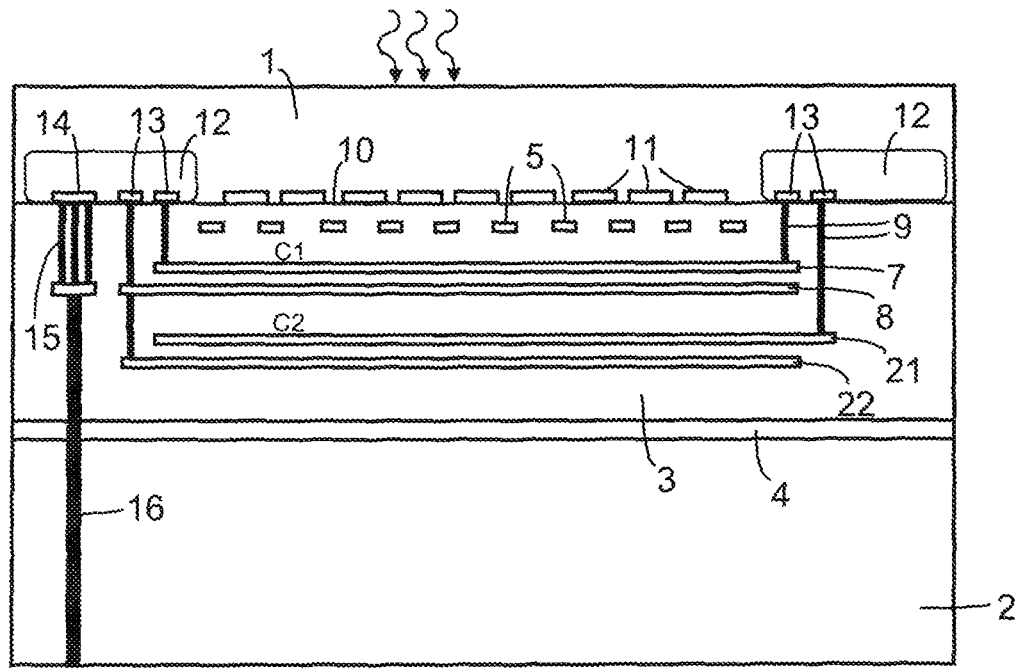
FIG. 9 is a cross-section according to FIG. 8 for a further backside illuminated image sensor with stacked capacitors.

FIG. 9 is a cross-section according to FIG. 8 for a further example of an image sensor with stacked capacitors. Elements of the image sensor according to FIG. 9 that correspond to elements of the image sensor according to FIG. 8 are designated with the same reference numerals. In the image sensor according to FIG. 9, the first capacitor layer 7 and the third capacitor layer 21 are connected with different contact regions 13, while the second capacitor layer 8 and the fourth capacitor layer 22 are electrically connected.

Figure 10:
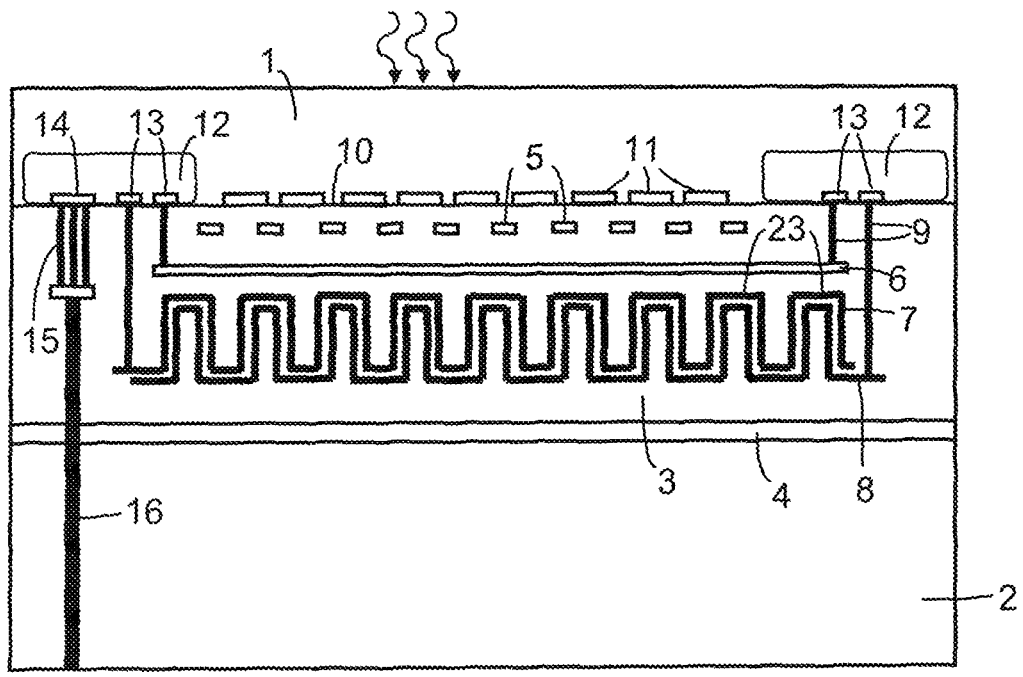
FIG. 10 is a cross-section according to FIG. 1 for a backside illuminated image sensor with trench capacitors.

FIG. 10 is a cross-section according to FIG. 1 for an image sensor with a capacitor comprising a three-dimensional structure. Elements of the image sensor according to FIG. 10 that correspond to elements of the image sensor according to FIG. 1 are designated with the same reference numerals. In the image sensor according to FIG. 10, the first capacitor layer 7 and the second capacitor layer 8 are arranged in trenches 23 formed in the dielectric layer 3. The capacitance of the capacitor can be substantially increased by such a three-dimensional structure. Furthermore, the first capacitor layer 7 can form a further capacitor with the optional further electrically conductive layer 6, for example. The further electrically conductive layer 6 may also serve as a light shield or as an absorbing layer.

By combining the capacitor structures shown in FIGS. 1, 5, 7, 8, 9 and 10, a variety of circuits can be realized in a very compact semiconductor device.

As the image sensor is illuminated from the rear side, the capacitors can be placed at the front side of the pixel array without increasing the size of the image sensor. This is advantageous for applications in miniature camera modules, for instance.

Better decoupling of the power supply makes the image sensor less sensitive to variation in the supplied voltage. Such variation may be caused by changes in current consumption of the image sensor or the tip of the endoscopy camera. Variations in current consumption may occur, for example, when the sensor switches from exposure to readout. This can cause a change in the signals read at the first rows of the image. Current consumption may also be dependent on the signal levels. E. g. a sensor may consume more current when reading white pixels than black pixels. In that case the content of the image can determine current consumption. If the supply varies with this consumption, certain patterns may occur in the image sensor (like horizontal bands at left and right of a white area or vertical tails under white exposed areas).

A stabler clock improves readout characteristics, as exposure times, frame rate and data rates are stabler. The signal is easier to recover at the receiver side. It is also easier to synchronize multiple devices, e. g. a stereo camera pair, or a light source and an image sensor.

On-chip voltage regulators make it possible to improve the performance of the pixels. A high voltage for the pixel reset level can be generated on chip by charge pumps to increase the dynamic range. Negative voltages can be created on-chip to drive the transfer gate and improve the dark current and dynamic range.

A uniform bottom plate ensures similar electrical coupling to the high impedance nodes of the pixel circuit, such as the floating diffusion (sense node). That is important to avoid any differences in gain of the pixels or any signal-dependent interferences. A uniform large bottom plate may be connected to ground, $V_{DD}$ or another fixed reference voltage. In order to keep the back reflectance and capacitive coupling identical in all pixels, the capacitor can also be constructed by an identical pattern in each pixel. This allows to comply with maximum density coverage rules and to use capacitors with two floating terminals. This scheme can be extended to a repetitive pattern per pairs of pixels or four or more pixels.

The described backside illuminated image sensor allows an integration of capacitors outside the region surrounding the pixel array of the image sensor. This integration scheme enables to realize a very compact image sensor and at the same time to achieve a substantial improvement of its performance.

The invention claimed is:

1. A backside illuminated image sensor, comprising:
a substrate of semiconductor material having a main surface,
detector elements arranged at the main surface wherein the detector elements form an array of pixels,
a dielectric layer on or above the main surface,
a first capacitor layer of electrically conductive material embedded in the dielectric layer, and
a second capacitor layer of electrically conductive material embedded in the dielectric layer at a distance from the first capacitor layer, the first and second capacitor layers forming at least one capacitor, wherein:
a peripheral circuit is integrated in the substrate apart from the detector elements, the peripheral circuit being configured for one or more operations of the group consisting of voltage regulation, charge pump operation and stabilization of clock generation,
the first and second capacitor layers are electrically connected with contact regions of the peripheral circuit, and
the at least one capacitor includes a charge pump capacitor for transfer gates of the pixels, a charge pump capacitor for reset gates of the pixels, a capacitor for stabilization of clock generation and/or a capacitor for analog-to-digital conversion references.

2. The backside illuminated image sensor of claim 1, wherein at least one of the first and second capacitor layers comprises parallel strips arranged at a distance from one another.

3. The backside illuminated image sensor of claim 1, wherein each of the first and second capacitor layers comprises parallel strips arranged at a distance from one another.

4. The backside illuminated image sensor of claim 3, wherein the strips of the first capacitor layer are parallel to the strips of the second capacitor layer.

5. The backside illuminated image sensor of claim 4, wherein the strips of the first capacitor layer and the strips of the second capacitor layer are interdigitated, the strips of the first capacitor layer are electrically connected to one another, and the strips of the second capacitor layer are electrically connected to one another.

6. The backside illuminated image sensor of claim 3, wherein the strips of the first capacitor layer are transverse to the strips of the second capacitor layer.

7. The backside illuminated image sensor of claim 1, wherein the first and second capacitor layers are arranged in a three-dimensional structure.

8. The backside illuminated image sensor of claim 1, wherein the first capacitor layer and/or the second capacitor layer comprises metal.

9. The backside illuminated image sensor of claim 1, wherein the first capacitor layer and/or the second capacitor layer comprises polysilicon.

10. The backside illuminated image sensor of claim 1, wherein a high-.kappa. dielectric is arranged between the first capacitor layer and the second capacitor layer.

11. The backside illuminated image sensor of claim 1, wherein the peripheral circuit has a width of less than 100 µm.

12. The backside illuminated image sensor of claim 1, wherein the peripheral circuit surrounds the detector elements.

13. The backside illuminated image sensor of claim 1, further comprising: a further substrate of semiconductor material, the further substrate being bonded to the substrate, and the dielectric layer being arranged between the substrate and the further substrate.

14. The backside illuminated image sensor of claim 13, further comprising: a further dielectric layer on the further substrate, the further dielectric layer being arranged between the further substrate and the dielectric layer, and the first capacitor layer and the second capacitor layer being embedded in the further dielectric layer.

15. The backside illuminated image sensor of claim 13, further comprising: a through-substrate interconnection penetrating the further substrate.

16. The backside illuminated image sensor of claim 15, further comprising:
- a further contact region in the peripheral circuit, and
- a further electric connection connecting the through-substrate interconnection with the further contact region.

* * * * *